(12) United States Patent
Yasuda et al.

(10) Patent No.: US 8,723,248 B2
(45) Date of Patent: May 13, 2014

(54) NONVOLATILE SEMICONDUCTOR STORAGE DEVICE

(75) Inventors: Naoki Yasuda, Yokohama (JP); Jun Fujiki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/404,073

(22) Filed: Feb. 24, 2012

(65) Prior Publication Data

US 2012/0205735 A1    Aug. 16, 2012

Related U.S. Application Data

(63) Continuation of application No. PCT/JP2009/004075, filed on Aug. 25, 2009.

(51) Int. Cl.
*H01L 21/28* (2006.01)
*H01L 27/115* (2006.01)
*H01L 29/66* (2006.01)
*H01L 29/788* (2006.01)
*H01L 29/792* (2006.01)

(52) U.S. Cl.
USPC .............. 257/324; 257/E29.309; 257/E29.33; 257/E21.679; 257/E27.104; 257/E29.304; 438/276; 438/261; 438/266

(58) Field of Classification Search
CPC ...................... H01L 27/1157; H01L 29/66833; H01L 29/792; H01L 29/788; H01L 27/115; H01L 21/28282
USPC ..................... 257/E29.309, E29.33, E21.209, 257/E21.679, E21.68, E27.098, E27.104, 257/E29.304, 390, 504, 314, E21.409, 257/E21.422, E21.682, E21.703, E29.128, 257/E29.129, E29.302, 324; 438/201, 211, 438/146, 174, 266, 276, 289, 261
See application file for complete search history.

(56) References Cited

U.S. PATENT DOCUMENTS 6,166,958 A * 12/2000 Naruke et al. ........... 365/185.24
(Continued)

FOREIGN PATENT DOCUMENTS

JP      6-077500 A      3/1994
JP      06077500 A   *  3/1994   ............ H01L 29/788
(Continued)

OTHER PUBLICATIONS

International Search Report mailed on Sep. 2, 2010, issued for International Application No. PCT/JP2009/004075 filed Aug. 25, 2009 (with English translation of Categories).

(Continued)

*Primary Examiner* — Jarrett Stark
*Assistant Examiner* — Bitew Dinke
(74) *Attorney, Agent, or Firm* — Oblon, Spivak, McClelland, Maier & Neustadt, L.L.P.

(57) ABSTRACT

In one embodiment, there is provided a nonvolatile semiconductor storage device. The device includes: a plurality of nonvolatile memory cells. Each of the nonvolatile memory cells includes: a first semiconductor layer including a first source region, a first drain region, and a first channel region; a block insulating film formed on the first channel region; a charge storage layer formed on the block insulating film; a tunnel insulating film formed on the charge storage layer; a second semiconductor layer formed on the tunnel insulating film and including a second source region, a second drain region, and a second channel region. The second channel region is formed on the tunnel insulating film such that the tunnel insulating film is located between the second source region and the second drain region. A dopant impurity concentration of the first channel region is higher than that of the second channel region.

9 Claims, 15 Drawing Sheets

(56) References Cited

U.S. PATENT DOCUMENTS

| | | | |
|---|---|---|---|
| 7,075,828 B2 * | 7/2006 | Lue et al. | 365/185.24 |
| 7,576,386 B2 | 8/2009 | Lue et al. | |
| 7,885,106 B2 | 2/2011 | Fujiki et al. | |
| 8,471,295 B2 * | 6/2013 | Lee | 257/204 |
| 2003/0139011 A1 * | 7/2003 | Cleeves et al. | 438/257 |
| 2003/0198087 A1 * | 10/2003 | Kinsey et al. | 365/185.18 |
| 2004/0108537 A1 * | 6/2004 | Tiwari | 257/314 |
| 2004/0152262 A1 * | 8/2004 | Ichige et al. | 438/257 |
| 2005/0286287 A1 * | 12/2005 | Park et al. | 365/63 |
| 2006/0202252 A1 * | 9/2006 | Wang et al. | 257/314 |
| 2007/0012988 A1 * | 1/2007 | Bhattacharyya | 257/314 |
| 2007/0045718 A1 * | 3/2007 | Bhattacharyya | 257/324 |
| 2008/0128787 A1 * | 6/2008 | Kato | 257/321 |
| 2008/0216376 A1 | 9/2008 | Pikielny | |
| 2008/0303080 A1 * | 12/2008 | Bhattacharyya | 257/324 |
| 2010/0117136 A1 | 5/2010 | Yasuda | |
| 2010/0213527 A1 * | 8/2010 | Shim et al. | 257/314 |
| 2011/0074498 A1 * | 3/2011 | Thompson et al. | 327/543 |
| 2011/0186937 A1 * | 8/2011 | Scheiper et al. | 257/402 |
| 2011/0284966 A1 * | 11/2011 | Wen et al. | 257/368 |

FOREIGN PATENT DOCUMENTS

| | | |
|---|---|---|
| JP | 2006-005363 A | 1/2006 |
| JP | 2007-317923 A | 12/2007 |

OTHER PUBLICATIONS

International Written Opinion mailed on Sep. 2, 2010 for International Application No. PCT/JP2009/004075 filed Aug. 25, 2009.

* cited by examiner

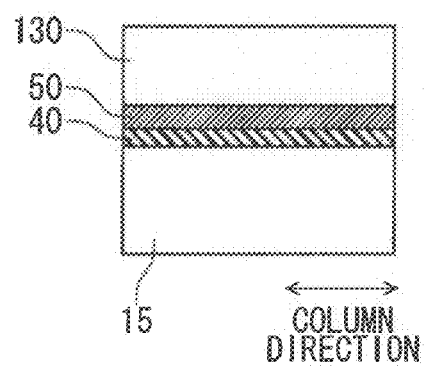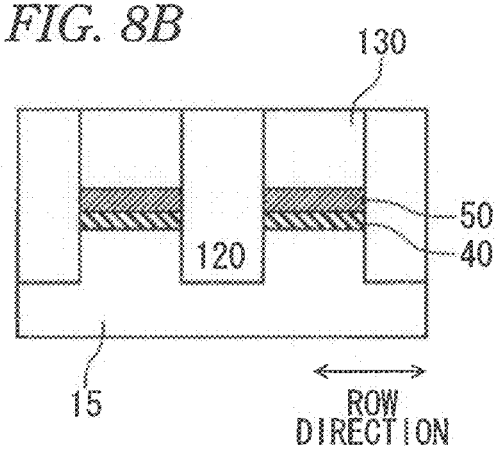

NONVOLATILE SEMICONDUCTOR STORAGE DEVICE

This is a Continuation application of PCT Application No. PCT/JP2009/004075, filed on Aug. 25, 2009, which was published under PCT Article 21(2) in Japanese, the entire contents of which are incorporated herein by reference.

BACKGROUND

1. Field

Embodiments described herein relate to a nonvolatile semiconductor storage device.

2. Description of the Related Art

Memory cell transistors used in NAND flash memories have been increased in miniaturization with the advancement of their generation. However, the thinning of the insulating film has not kept up with the shortening of the transistor gate length. This causes a problem when data is written/erased or read using miniaturized memory cell transistors.

More specifically, there occurs a contradictory relationship between the short-channel effect which appears at the time of reading from a memory cell transistor and erroneous writing to an unselected memory cell at the time of writing to a NAND column. The short-channel effect is a phenomenon that when the gate length of a MIS transistor is made too short, the gate electrode cannot control the channel region and the transistor does not exhibit a clear on-off characteristic. To suppress the short-channel effect, it is necessary to increase the substrate impurity concentration of a transistor. However, when the substrate impurity concentration is increased, it becomes more difficult to increase the channel potential of unselected memory cells at the time of writing. If the channel potential of unselected memory cells is not increased sufficiently, a strong electric field is exerted on the insulating films of the unselected memory cells and hence erroneous writing is prone to occur.

On the other hand, when the substrate impurity concentration of a transistor is decreased, a remarkable short-channel effect appears at the time of reading though the probability of occurrence of erroneous writing becomes low. As described above, there is the contradictory relationship that the short-channel effect and the erroneous writing cannot be suppressed at the same time. This becomes more serious as the gate length is made shorter.

There is another problem which particularly relates to MONOS memory cells which employ an insulating film (silicon nitride film) as a charge storage layer. That is, when writing/erasure is performed repeatedly in a MONOS memory, defects are produced at a substrate interface (charge injection side), as a result of which the Id-Vg characteristic (transfer characteristic) of the memory cell transistors is degraded. In general, the charge storage layer is a conductive layer such as a floating gate electrode, discrete conductive layers of, for example, a nano-dot memory, an insulating layer having traps such as a silicon nitride film of MONOS (metal-oxide-nitride-oxide-silicon), or the like.

A technique for avoiding the above degradation is known in which p-channel MONOS transistors are formed. Wiring/erasure is performed by injecting carriers from the gate electrode side, and data is read out by channels formed on the opposite side, that is, at the substrate-side interface.

In US2007/0029625A, charge injection and data reading are performed by different regions. The gate electrode for charge injection is made of polycrystalline silicon having a high dopant impurity concentration or a metal. That is, a transistor having a channel region is not formed on the gate side. Therefore, whereas an inversion layer is formed on the gate side at the time of data reading by a charge supply control by a selection gate transistor, a depletion layer is formed (no inversion layer is formed) on the gate side in unselected cells at the time of writing. As exemplified by this, it is impossible to perform a control relating to the gate-side depletion layer. As such, US2007/0029625A has a disadvantage that the depletion layer existing only on the substrate side should play two roles, that is, expansion of the depletion layer in an unselected cell at the time of writing and suppression of the short-channel effect through reduction of the depletion layer width at the time of reading. This contradiction becomes more remarkable as memory cells are increased in miniaturization.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention:

FIGS. 8A and 8B show a manufacturing step of the nonvolatile semiconductor storage device according to the second embodiment;

DETAILED DESCRIPTION

Figure 1:
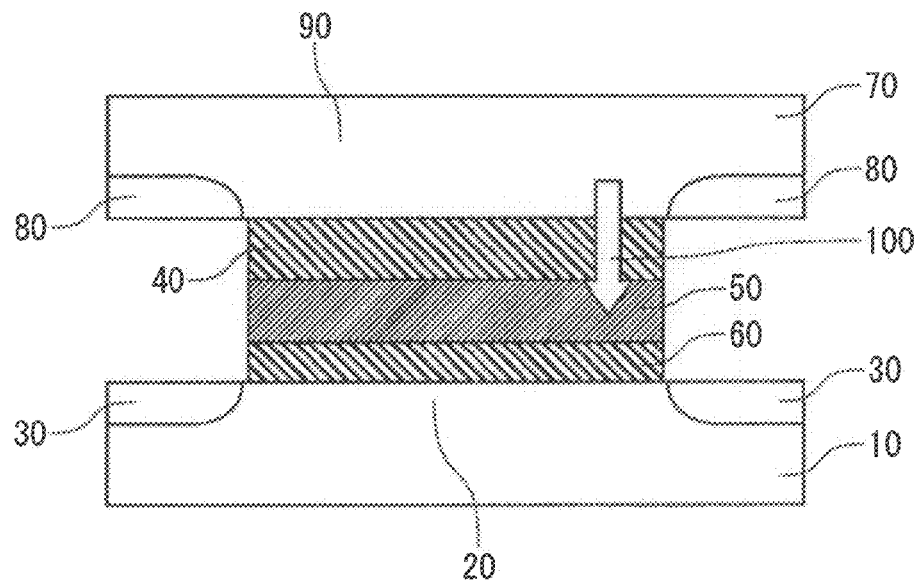
FIG. 1 shows a nonvolatile semiconductor storage device according to a first embodiment.

According to an embodiment, there is provided a nonvolatile semiconductor storage device including: a plurality of nonvolatile memory cells. Each of the nonvolatile memory cells includes: a first semiconductor layer including: a first source region and a first drain region spaced from each other; a first channel region formed between the first source region and the first drain region; a block insulating film formed on the first channel region such that the block insulating film is located between the first source region and the first drain region; a charge storage layer formed on the block insulating film; a tunnel insulating film formed on the charge storage layer; a second semiconductor layer formed on the tunnel insulating film and including: a second source region and a second drain region spaced from each other such that the tunnel insulating film is located between the second source region and the second drain region; and a second channel region formed between the second source region and the second drain region, wherein a dopant impurity concentration of the first channel region is higher than a dopant impurity concentration of the second channel region.

Embodiments of the present invention will be hereinafter described with reference to the drawings. The same symbols denote the same thing in the drawings to be referred to below, and thus redundant descriptions will be omitted.

Embodiment 1

FIG. 1 is a schematic diagram of a memory cell according to the invention. A nonvolatile semiconductor storage device is composed of plural nonvolatile memory cells.

Each of memory cells constituting the nonvolatile semiconductor storage device according to this embodiment is formed on a semiconductor substrate 10, and is composed of first source/drain regions 30 formed in a semiconductor layer constituting a semiconductor substrate 10 so as to be separated from each other, a block insulating film 60 formed on a first channel region 20 existing between the first source/drain regions 30, a charge storage layer 50 formed on the block insulating film 60, a tunnel insulating film 40 formed on the charge storage layer 50, a second channel region 90 formed on the tunnel insulating film 40, that is, in a semiconductor layer 70, and second source/drain regions 80 formed in the second semiconductor layer 70 on both sides of the second channel region 90.

The channel region means a region where a channel can be formed in a state that a potential is applied to it. As mentioned in the prior art section, in general, the charge storage layer is a conductive layer such as a floating gate electrode, discrete conductive layers of, for example, a nano-dot memory, an insulating layer having traps such as a silicon nitride film of MONOS (metal-oxide-nitride-oxide-silicon), or the like. As also mentioned in the prior art section, the block insulating film is an insulating film which is introduced to block a current to prevent it from passing through a memory cell and through which a current is less apt to flow in a strong electric field range than the tunnel insulating film. Usually, the block insulating film has a larger capacitance than the tunnel insulating film because the voltage proportion across the tunnel insulating film is increased by increasing the capacitance of the block insulating film. Example methods for making the capacitance of the block insulating film larger than that of the tunnel insulating film are (1) increasing the area of the former, (2) increasing the permittivity of the former, and (3) decreasing the thickness of the former.

The semiconductor substrate 10 and the semiconductor layer 70 are commonly made of single-crystal Si. Other example materials of them are polycrystalline Si, amorphous Si, Ge, compound semiconductors, SOI (silicon on insulator), and organic polymers.

In general, the tunnel insulating film 40 is a single layer film containing a silicon oxide or a multilayer film. To enhance the performance and increase the reliability of the tunnel insulating film, nitrogen may be added into it.

The charge storage layer 50 is commonly made of silicon nitride ($Si_3N_4$). Other example materials of it are silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium aluminate nitride (HfAlON), hafnium silicate (HfSiO), hafnium silicate nitride (HfSiON), lanthanum oxide ($La_2O_3$), and lanthanum aluminate ($LaAlO_3$).

Example materials of the block insulating film 60 are silicon oxide ($SiO_2$), aluminum oxide ($Al_2O_3$), aluminum oxynitride (AlON), hafnia ($HfO_2$), hafnium aluminate ($HfAlO_3$), hafnia nitride (HfON), hafnium aluminate nitride (HfAlON), hafnium silicate (HfSiO), hafnium silicate nitride (HfSiON), lanthanum oxide ($La_2O_3$), and lanthanum aluminate ($LaAlO_3$).

In FIG. 1, the tunnel insulating film 40 is disposed on the gate side and carriers are injected from the gate side (in the direction indicated by arrow 100). However, another structure is possible in which the tunnel insulating film 40 is disposed on the opposite side, that is, on the side of the semiconductor substrate 10, and carriers are injected from side of the semiconductor substrate 10. Even in the latter structure, the essential part of the concept of the embodiment remains the same.

That is, although in the embodiment the tunnel insulating film 40 is located on the gate side and the block insulating film 60 is located on the substrate side, the opposite arrangement is possible in which the tunnel insulating film 40 is located on the substrate side and the block insulating film 60 is located on the gate side.

Next, the principle of operation of the embodiment will be described.

Figure 2:
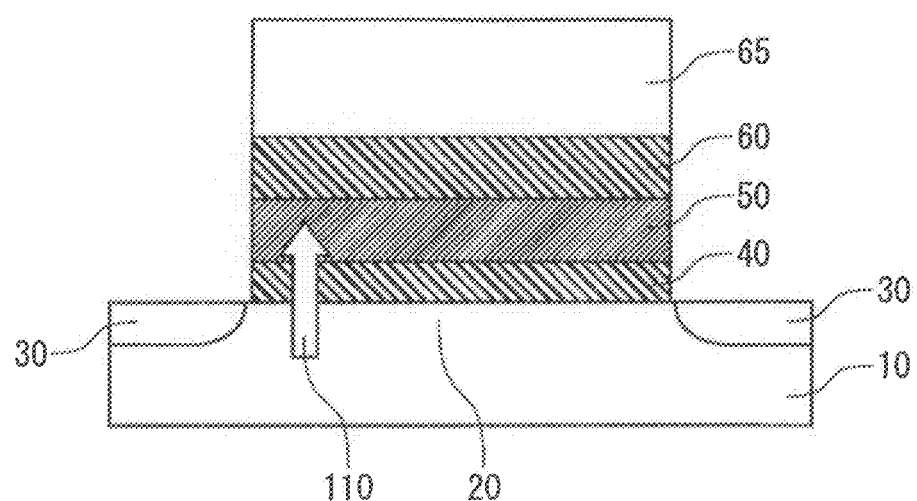
FIG. 2 shows the basic principle of a conventional memory cell.

FIG. 2 shows the basic principle of a conventional memory cell.

FIG. 2 schematically shows the structure and operation of a conventional memory cell. Writing/erasure is performed on the memory cell by injecting charge from the first channel region 20 (i.e., from the side of the semiconductor substrate 10; in the direction indicated by arrow 110). Data is read out using the first channel region 20 from which writing/erasure was performed.

In this case, as descried in the background art section, it is impossible to attain both of suppression of the short-channel effect at the time of reading and suppression of erroneous writing in unselected memory cells at the time of writing. This is because the depletion layer in the first channel region 20 is required to play two contradictory roles. One of the two roles is expansion of the depletion layer in an unselected cell at the time of writing. The other role is suppression of the depletion layer width at the time of data reading. In the conventional memory cell structure shown in FIG. 2, the contradiction between the two roles of the depletion layer becomes more serious as the memory cell is increased in miniaturization. Therefore, with the conventional memory cell structure, it is difficult to increase the miniaturization of the memory cell.

To solve the above problem, that is, to solve the contradiction relating to the depletion layer width (or the dopant impurity concentration) of the channel region, in the embodiment (see FIG. 1), different regions play the role of expanding the depletion layer in an unselected cell at the time of writing and the role of suppressing the short-channel effect by keeping the depletion layer width small at the time of data reading.

That is, as shown in FIG. 1, the embodiment is characterized in that the two roles of the depletion layer are separated from each other by providing the second channel layer 90. More specifically, the semiconductor region on the side of the tunnel insulating film 40 is given a low dopant impurity concentration and the semiconductor region on the side of the block insulating film 60 is given a high dopant impurity concentration. Data reading is performed by using the first channel region 20 of the transistor that is formed in the semiconductor region located on the side of the block insulating film 60.

The above-described structure according to the embodiment provides the following advantages. First, since the dopant impurity concentration is set low at the interface between the tunnel insulating film 40 and the semiconductor layer 70 which are located on the side from which charge is injected at the time of writing, the depletion layer can be expanded in an unselected memory cell at the time of writing. As a result, the voltage across the block insulating film 60 is reduced and erroneous writing can thereby be prevented. In the case of writing, suppression of the short-channel effect is not required in both of selected memory cells and unselected ones and hence the dopant impurity concentration of the channel region can be set low.

On the other hand, in the embodiment, the dopant impurity concentration is set high at the surface of the data-reading-side semiconductor substrate 10 to suppress the short-channel effect of the data-reading-side (block-insulating-film-60-side) transistor. This enables data reading that is free of an error.

Performing data reading at the interface between the semiconductor substrate 10 and the block insulating film 60 which are located on the opposite side to the charge injection side provides the following two additional advantages.

The first advantage is that a phenomenon that defects are produced at the above interface by repetitive writing/erasing operations and the threshold voltage is thereby varied can be avoided. This is because in the structure of the embodiment almost no charge passes through the interface between the semiconductor substrate 10 and the block insulating film 60 which are located on the data reading side and hence production of defects can be suppressed. The second advantage is that the close proximity effect (inter-cell interference) can be suppressed in the case of MONOS memory cells. This is because in MONOS memory cells charge is captured by the charge storage layer 50/block insulating film 60 interface which is close to the data-reading-side interface.

In contrast, in ordinary MONOS memory cells, as shown in FIG. 2, the electrical distance between the first channel region 20 which is in charge of carrier injection and data reading and the charge storage layer 50/block insulating film 60 interface is long. Therefore, the interference effect between adjoining memory cells is not negligible.

On the other hand, in the memory cell according to the embodiment, as shown in FIG. 1, since data reading is performed at the semiconductor surface (first channel region 20) located on the opposite side to the charge injection side, the electrical distance between the first channel region 20 and the charge storage layer 50/block insulating film 60 interface is short. Therefore, the interference effect between adjoining memory cells is weak.

The reason why the interference effect between adjoining memory cells becomes weaker as the distance between the semiconductor region 20 which is in charge of data reading and the charge storage layer 50/block insulating film 60 interface where captured charge exists is shortened is as follows. If captured charge of the memory cell exists at a position that is close to the semiconductor layer 20, a large number of electric field lines extending from the charge are terminated at the semiconductor layer 20 and only a small number of electric field lines extending from the charge are terminated at the charge storage layer 50 (or the charge storage layer 50/block insulating film 60 interface) of the adjacent cells. On the other hand, charge exists at a position that is distant from the semiconductor layer 20, only a small number of electric field lines reach the semiconductor layer 20 and a large number of electric field lines extending from the charge are terminated at the charge storage layer 50 (or the charge storage layer 50/block insulating film 60 interface) of the adjacent cells. It is therefore concluded that the interference effect between adjoining memory cells is weaker when charge exists at a position that is close to the semiconductor layer 20.

According to this embodiment, the two roles of the depletion layer are separated from each other by disposing the second channel region 90 for charge injection and the first channel region 20 for data reading over and under the insulating film stack of the memory cell. That is, the second channel region 90 is in charge of expansion of the depletion layer in an unselected cell at the time of writing and the first channel region 20 provides a high dopant impurity concentration that is necessary for a data reading transistor operation. Separating the roles of the depletion layer from each other in this manner makes it possible to solve the contradiction between the requirements for the depletion layer which becomes more serious as transistors are increased in miniaturization. Thus, the miniaturization of memory cells can be increased further by using the structure according to the embodiment.

Embodiment 2

Figure 3A:
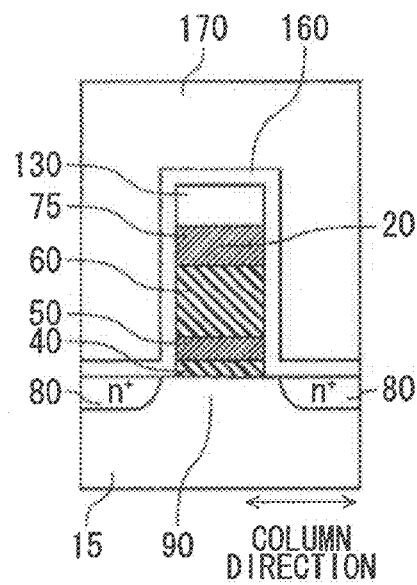
FIGS. 3A and 3B show a nonvolatile semiconductor storage device according to a second embodiment.
Figure 3B:
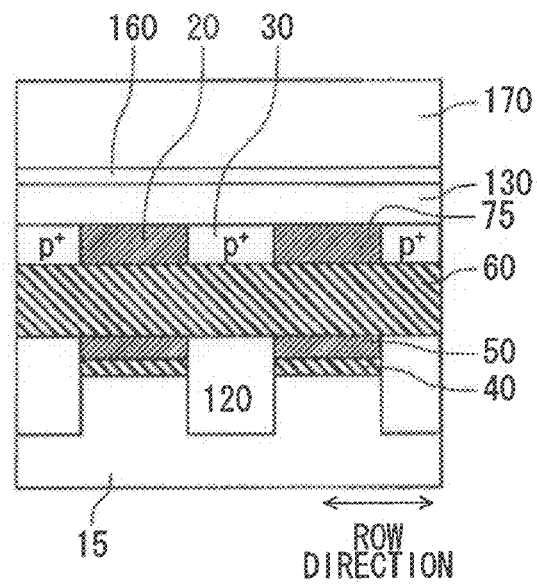

FIGS. 3A and 3B are schematic diagrams of a memory cell of a nonvolatile semiconductor storage device according to a second embodiment of the invention. In this embodiment, the second channel region 90 is formed in a semiconductor substrate 15. FIG. 3A is a sectional view taken along the channel length direction of the second channel region 90, and FIG. 3B is a sectional view taken along the channel width direction of the second channel region 90. In these drawings, the channel length direction is the column direction in which bit lines extend and the channel width direction is the row direction in which word lines (first channel regions 20 and first source/drain regions 30) extend.

Adjacent to the surface of a p-type silicon substrate (semiconductor substrate 15), $n^+$ source/drain diffusion layers (second source/drain regions 80) are formed so as to be spaced from each other. The second channel region 90 is the region located between the source diffusion layer and the drain diffusion layer. When the nonvolatile memory cell is turned on, a channel that establishes electrical continuity between the second source/drain regions 80 is formed in the second channel region 90.

The second source/drain regions 80 are usually $n^+$ diffusion layers. However, where a NAND memory cell unit is formed by connecting plural memory cells (each configured as described above) to each other in series, $n^+$ silicon diffusion layers need not always be formed as the second source/drain regions 80.

This is because inversion layers induced adjacent to the surface of the semiconductor substrate 15 by fringe electric fields extending from the gates of the adjacent memory cells can be used as source/drain electrodes. In this case, $n^+$ silicon diffusion layers need not be formed as the second source/drain regions 80 and the p-type semiconductor remain there.

Figure 4:
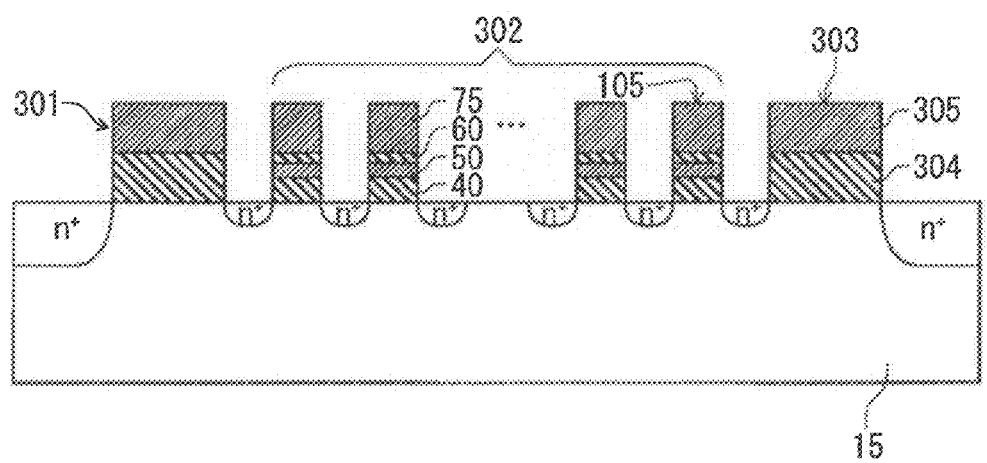
FIG. 4 shows a NAND memory cell unit according to the second embodiment.

For example, as shown in FIG. 4, a NAND memory cell unit can be formed by connecting plural memory cells 105 to each other in series and selection gate transistors 301 and 302 to the two respective end memory cells 105 of the series connection. The plural memory cells 105 constitute a cell transistor series 302. It is preferable that the selection gate transistors 301 and 302 have the MOS (metal oxide semiconductor) structure.

Next, the structure of the gate stack which is located on the semiconductor substrate 15 will be described. A 5-nm-thick silicon oxynitride (SiON) film, for example, is formed as the tunnel insulating film 40 on the second channel region 90. The silicon oxynitride film has an average composition $(SiO_2)_{0.8}(Si_3N_4)_{0.2}$, for example. A 5-nm-thick silicon nitride $(Si_3N_4)$ film is formed as the charge storage layer 50 on the tunnel insulating film 40. A 15-nm-thick alumina $(Al_2O_3)$ film, for example, is formed as the block insulating film 60 on the charge storage layer 50. An n-type semiconductor layer 75 is formed as the first channel region 20 on the block insulating film 60. As shown in FIG. 3(b), p$^+$ first source/drain regions 30 are formed adjacent to the first channel region 20.

Plural tunnel insulating films 40 and plural charge storage layers 50 are formed in the row direction so as to be isolated from each other by device isolation insulating layers 120 having an STI (shallow trench isolation) structure. The block insulating film 60 which is formed on the charge storage layers 50 extend in the row direction. Plural first channel regions 20 and plural p$^+$ first source/drain regions 30 are arranged in the row direction and serve as control gate electrode (word lines) or transistors arranged in series.

In the embodiment, the block insulating film 60 extends in the word line direction. With this structure, the degree of leakage of electric fields in the word line direction (due to fringe electric fields) is made low, which provides an advantage that an electric field extending from the first channel region 20 can reach the tunnel insulating film 40 efficiently even if the memory cell transistors are increased in miniaturization.

In the embodiment, the p-type dopant impurity concentration of the second channel region 90 of the semiconductor substrate 15 is set at $1 \times 10^{18}$ cm$^{-3}$. The n-type dopant impurity concentration of the first channel region 20 which functions as a control gate electrode is set at $1 \times 10^{19}$ cm$^{-3}$.

As described above, the dopant impurity concentration of the first channel region 20 is higher than that of the second channel region 90. It is desirable that the dopant impurity concentration of the first channel region 20 be higher than that of the second channel region 90 by about one order (about 5 to 50 times that of the second channel region 90). This is understood from a simple calculation of a C-V characteristic. Where the combination of dopant impurity concentrations of the embodiment is used, operation voltages can be set so that at the time of writing an effective voltage 5 MV/cm is obtained in unselected memory cells and an effective voltage 15 MV/cm is obtained in selected memory cells at the time of writing. That is, write cells can clearly be discriminated from non-write cells, because the write threshold voltage of an ordinary tunnel insulating film $(SiO_2)$ is about 7 MV/cm in terms of the effective electric field.

The "effective electric field" is the electric flux density divided by the permittivity of $SiO_2$ and is also called an "$SiO_2$-converted electric field."

On the other hand, where the dopant impurity concentration of the first channel region 20 is different from that of the second channel region 90 by about two orders, a similar calculation shows that it is difficult to find proper electric field conditions. Therefore, it is appropriate that the dopant impurity concentration of the first channel region 20 be higher than that of the second channel region 90 by about one order (about 5 to 50 times that of the second channel region 90).

With the ITRS (International Technology Roadmap for Semiconductors) as a guide, it is found that the dopant impurity concentration of the first channel region 20 for data reading needs to be about $10^{17}$ to $10^{18}$ cm$^{-3}$ or higher. Furthermore, formation of a depletion layer is difficult if the dopant impurity concentration of the first channel region 20 is so high that it becomes a degenerate semiconductor. Therefore, the dopant impurity concentration of the first channel region 20 should be lower than $10^{20}$ cm$^{-3}$. Based on the above findings, it is concluded that the desirable range of the dopant impurity concentration of the first channel region 20 is $10^{17}$ to $10^{20}$ cm$^{-3}$.

It is desirable that the thickness of the tunnel insulating film 40 used in the embodiment be about 2 to 8 nm. In the embodiment, the tunnel insulating film 40 is a silicon oxynitride film. From the viewpoint of reducing defects inside the film, it is desirable that the silicon oxynitride film have an average composition $(SiO_2)_x(Si_3N_4)_{1-x}$ where $0.75 < x < 1$. Naturally, a silicon oxide $(SiO_2)$ film which corresponds to the limit composition of $x=1$ may be used. Where the tunnel insulating film 40 is a silicon oxynitride film, the height of the potential barrier against holes is made low, resulting in an advantage that a memory cell erasing operation becomes fast. Likewise, the tunnel insulating film 40 may be a multilayer tunnel insulating film such as one consisting of a silicon oxide film, a silicon nitride film, and a silicon oxide film (ONO tunnel insulating film). A high erasing operation speed can also be obtained in this case.

It is desirable that the thickness of the charge storage layer 50 used in the embodiment which is a silicon nitride film be about 2 to 10 nm. This silicon nitride film need not always have the stoichiometric composition $Si_3N_4$. It may have a Si-rich composition to increase the trap density inside the film or a N-rich composition to obtain deep trap levels. The silicon nitride film as the charge storage layer 50 may contain oxygen. And the silicon nitride film need not always be a film that is uniform in composition; its composition may vary in the thickness direction.

It is desirable that the thickness of the block insulating film 60 used in the embodiment which is an alumina film be about 5 to 20 nm. To reduce defects inside the film, the alumina film as the block insulating film 60 may contain nitrogen inside at a small concentration. The block insulating film 60 need not always be a single-layer aluminum film; for example, it may be a multilayer block insulating film such as one consisting of an alumina film, a silicon oxide film, and an alumina film (AOA film).

In the embodiment, the first channel region 20 and the p$^+$ first source/drain regions 30 which are adjacent to the first channel region 20 are made of polycrystalline silicon. However, they may be made of amorphous silicon or single-crystal silicon. As a further alternative, a Schottky barrier source and drain may be used in which each of the p$^+$ first source/drain regions 30 is replaced by a metal or a silicide. In this case, a method of increasing the Schottky barrier height by segregating a dopant impurity at the interfaces between the first channel region 20 and the p$^+$ first source/drain regions 30 may be employed.

Figure 5:
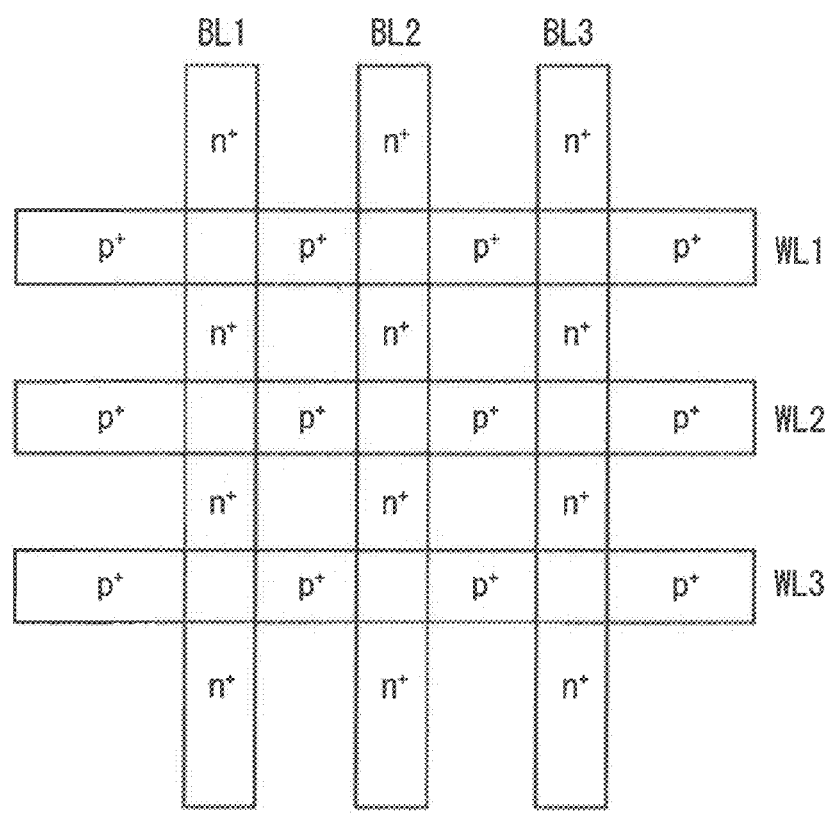
FIG. 5 is a schematic top view of a memory array according to the second embodiment.

FIG. 5 is a schematic top view of a memory array according to the embodiment. The gate stack consisting of the tunnel insulating film 40, the charge storage layer 50, and the block insulating film 60 exists at each of intersecting points of word lines WL and bit lines BL. As is apparent from this configuration, since the transistors are disposed over and under the gate stack, the functions of the word lines WL and the bit lines BL are symmetrical with each other and can be replaced with each other. That is, where data reading is performed using word lines WL, they function as bit lines. Therefore, the circuit configuration needs to be such that a reading circuit is provided not only on the bit line side but also on the word line side.

As for a driving method of this memory cell, a writing/ erasing operation is performed by injecting charge into the silicon nitride film (charge storage layer 50) from the surface of the semiconductor substrate 15 via the tunnel insulating film 40 and data reading is performed utilizing presence/ absence of a channel current flowing through the first channel region 20.

Next, a manufacturing method of the memory cell shown in FIGS. 3A and 3B will be described.

Figure 7A:
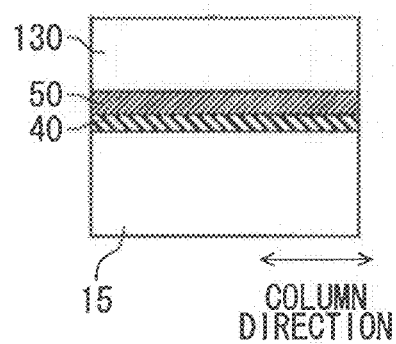
FIGS. 7A and 7B show a manufacturing step of the nonvolatile semiconductor storage device according to the second embodiment.
Figure 7B:
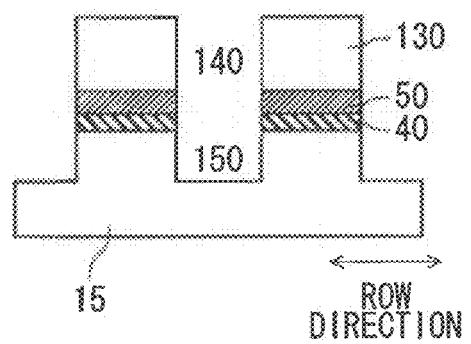
Figure 9A:
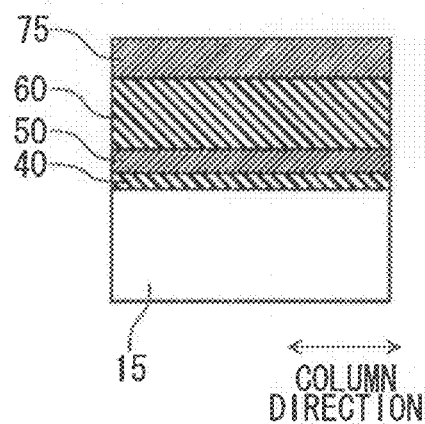
FIGS. 9A and 9B show a manufacturing step of the nonvolatile semiconductor storage device according to the second embodiment.
Figure 9B:
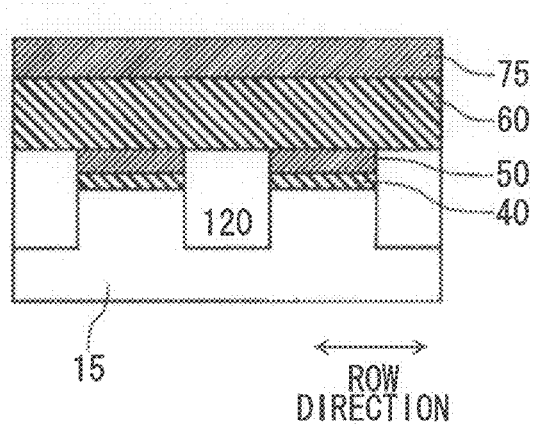

In each of FIGS. 7-13, FIGS. 7A, 8A, 9A . . . 13A show sectional views taken along the channel length direction of the second channel region 90 and FIGS. 7B, 8B, 9B . . . 13B show sectional views taken along the channel width direction of the second channel region 90.

First, as shown in FIGS. 7A and 7B, after the surface of a silicon substrate (semiconductor substrate 15; a case of a well formed in a substrate is included) doped with a p-type impurity is cleaned, a silicon oxide film is formed at a thickness of about 5 nm by thermal oxidation in a temperature range of 800° C. to 1,000° C. Then, the silicon oxide film is nitrided by a plasma nitriding method, whereby a silicon oxynitride film (tunnel insulating film 40) is formed.

Then, a 5-nm-thick silicon nitride film (charge storage layer 50) is formed on the tunnel insulating film 40 by LPCVD (low pressure chemical vapor deposition) in a temperature range of 600° C. to 800° C. using dichlorosilane ($SiH_2Cl_2$) and ammonia ($NH_3$) as material gases.

Then, a mask material 130 to be used for forming device isolation regions is formed on the silicon nitride film (charge storage layer 50). A photoresist is formed on the mask material 130 and then exposed and developed. A resulting photoresist pattern is transferred to the mask material 130 by RIE (reactive ion etching). The photoresist is removed thereafter.

In this state, the charge storage layer 50 and the tunnel insulating film 40 are etched in order by RIE using the mask material 130 as a mask, whereby slits 140 for separating memory cells that are adjacent to each other in the row direction are formed. Furthermore, the semiconductor substrate 15 is etched by RIE, whereby device isolation trenches 150 are formed at a depth of about 100 nm.

Subsequently, as shown in FIGS. 8A and 8B, a silicon oxide film (buried oxide film, device isolation insulating film 120) is formed by CVD so as to completely fill in the grooves each consisting of a slit 140 and a device isolation trench 150. Then, the silicon oxide film (device isolation insulating film 120) is polished by CMP (chemical mechanical polishing) until the mask material 130 is exposed, whereby the surface of the silicon oxide film (device isolation insulating film 120) is flattened.

Then, the buried oxide film (device isolation insulating film 120) is etched back by wet etching so that the bottom surface of the mask material 130 and the top surface of the buried oxide film (device isolation insulating film 120) are flushed each other. Then, the mask material 130 is removed selectively.

Subsequently, as shown in FIGS. 9A and 9B, an alumina film (block insulating film 60) is formed at a thickness of about 15 nm by ALD (atomic layer deposition) in a temperature range of 200° C. to 400° C. using TMA ($Al(CH_3)_3$) and $H_2O$ or $O_3$ as materials. Then, a semiconductor (polycrystalline silicon or amorphous silicon) layer 75 to become first channel regions 20 is deposited on the block insulating film 60 by CVD in a temperature range of about 550° C. to 650° C. using silane as a material gas.

Figure 10A:
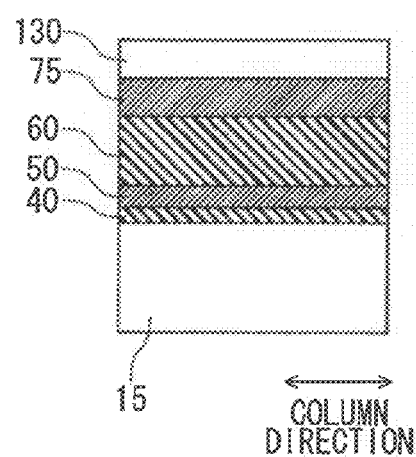
FIGS. 10A and 10B show a manufacturing step of the nonvolatile semiconductor storage device according to the second embodiment.
Figure 10B:
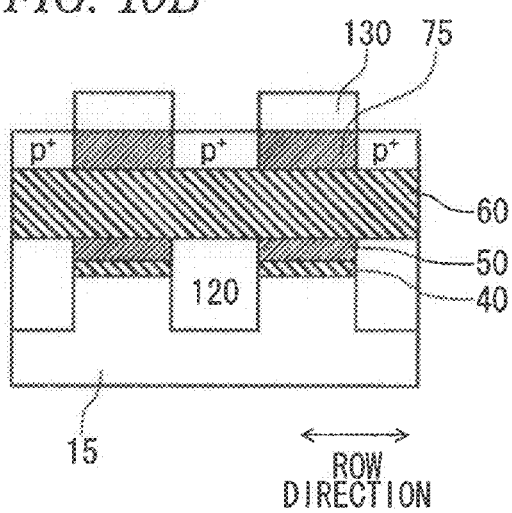

Then, as shown in FIGS. 10A and 10B, a mask material 130 is formed on the semiconductor layer 75 to become first channel regions 20 by depositing a silicon nitride film, for example. A photoresist is formed on the mask material 130 and then exposed and developed. Then, a resulting photoresist pattern is transferred to the mask material 130. The photoresist is removed thereafter. As a result, line patterns of the mask material 130 are formed so as to extend in the column direction.

Figure 11A:
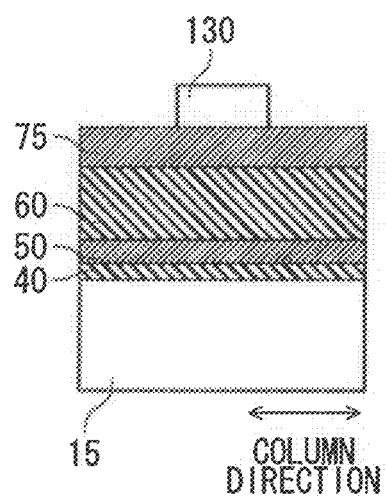
FIGS. 11A and 11B show a manufacturing step of the nonvolatile semiconductor storage device according to the second embodiment.
Figure 11B:
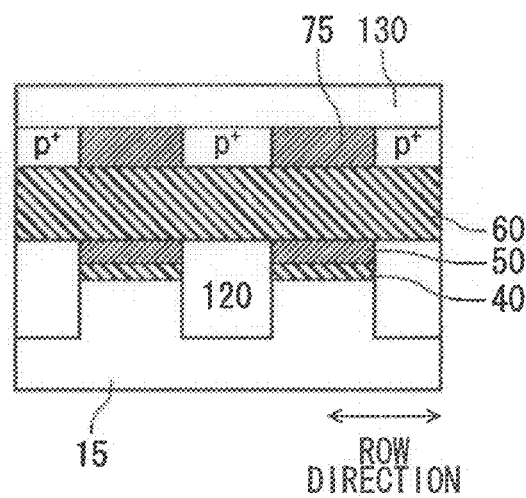

Subsequently, as shown in FIGS. 11A and 11B, a p-type dopant impurity (e.g., boron) is implanted by ion implantation using the mask material 130 as a mask. Then, $p^+$ source/ drain electrodes are formed by activation annealing. Activation annealing conditions need to be determined so that the p-type dopant impurity does not diffuse too much in the horizontal direction.

Then, after the mask material 130 is removed, another mask material 130 (typically a silicon nitride film) is deposited and line patterns that extend in the row direction this time is formed.

Figure 12A:
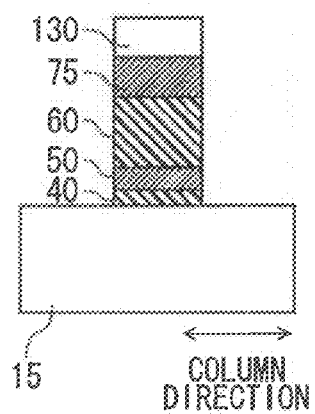
FIGS. 12A and 12B show a manufacturing step of the nonvolatile semiconductor storage device according to the second embodiment.
Figure 12B:
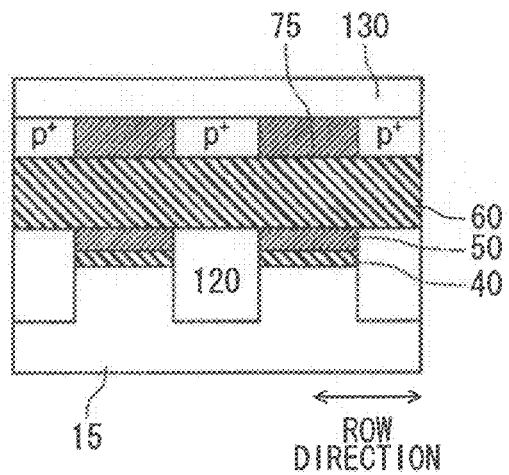

Then, as shown in FIGS. 12A and 12B, the semiconductor layer 75 to become first channel regions 20, the block insulating film 60, the charge storage layers 50, and the tunnel insulating films 40 are etched in order by RIE using the mask material 130 as a mask, whereby a MONOS gate stack shape is formed.

Figure 13A:
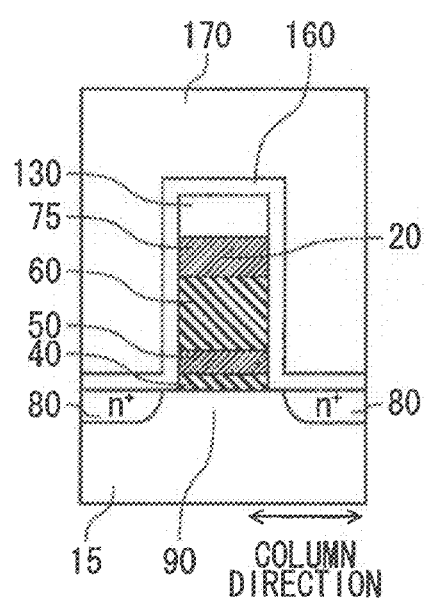
FIGS. 13A and 13B show a manufacturing step of the nonvolatile semiconductor storage device according to the second embodiment.
Figure 13B:
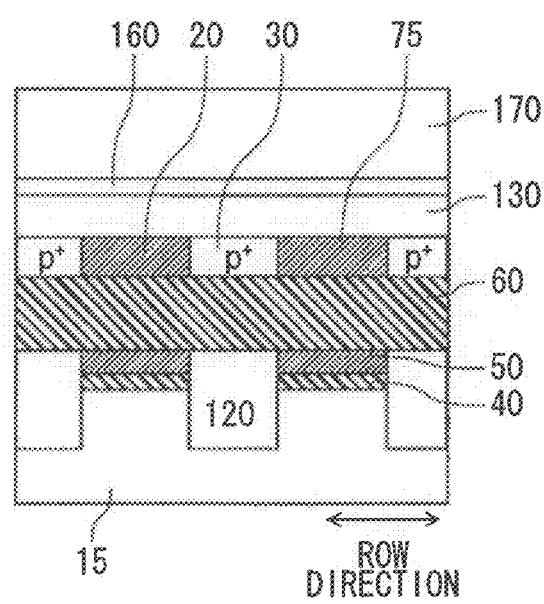

Then, a process (not shown) of forming a thin silicon oxide film on the side surfaces of the MONOS gate stack by CVD is executed. Then, as shown in FIGS. 13A and 13B, phosphorus (or arsenic or antimony) is introduced in a self-aligned manner by ion implantation and a thermal process is executed, whereby $n^+$ source/drain diffusion regions 80 are formed in the semiconductor substrate 15 so as to be adjacent to second channel regions 90, whereby memory cells are completed. Finally, an interlayer insulating film 170 is formed so as to cover an electrode side wall oxide film 160 and the memory cells.

The above-described manufacturing method is just an example, and the memory cells shown in FIG. 3 may be formed by other manufacturing methods.

For example, the $n^+$ sources and drains 80 for the second channel regions 90 and the $p^+$ sources and drains 30 for the first channel regions 20 may be formed by methods other than ion implantation, such as a method of depositing polycrystalline silicon doped with an impurity or a solid-phase diffusion method.

The manufacturing methods of the MONOS gate stack insulating films disposed over the semiconductor substrate 15 can be modified in the following manners. In the steps for forming the tunnel insulating film 40, the thermal oxidation method can be dry $O_2$ oxidation and other methods such as wet oxidation (hydrogen burning oxidation) and plasma oxidation using $O_2$ or $H_2O$ as material gases. In the step of nitriding the silicon oxide film, the nitrogen plasma step may be replaced by a thermal treatment step in an NO or $NH_3$ gas atmosphere.

The composition of the silicon nitride film (charge storage layers 50) can be varied by adjusting the flow rate ratio between dichlorosilane ($SiH_2Cl_2$) and ammonia ($NH_3$) which are material gases of LPCVD.

Instead of ALD, the alumina ($Al_2O_3$) film (block insulating film 60) may be formed by MOCVD (metal organic chemical vapor deposition) in a temperature range of 500° C. to 800° C. using TMA ($Al(CH_3)_3$) and $H_2O$ as material gases.

As for the formation of each of the films constituting the above-described substrate structure or MONOS gate stack structure, the material gas(es) of CVD (or ALD) may be replaced by another gas or other gases. CVD can be replaced by sputtering. And each film may be formed by methods other than CVD and sputtering, such as evaporation, a laser abrasion method, and MBE as well as combinations of these methods.

(Modification 1)

Figure 6A:
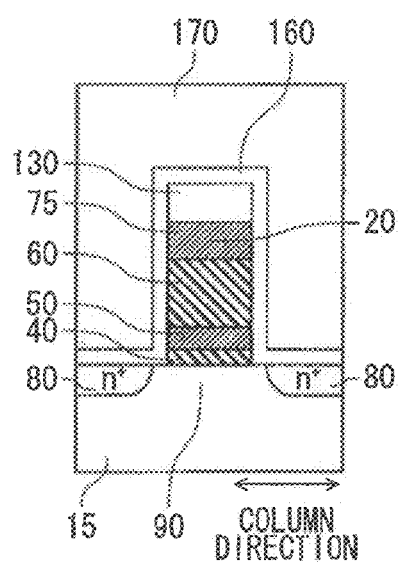
FIGS. 6A and 6B show the nonvolatile semiconductor storage device according to the second embodiment.
Figure 6B:
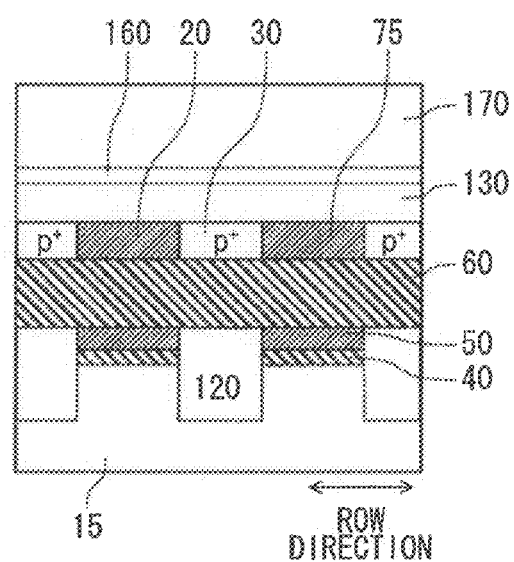
Figure 14A:
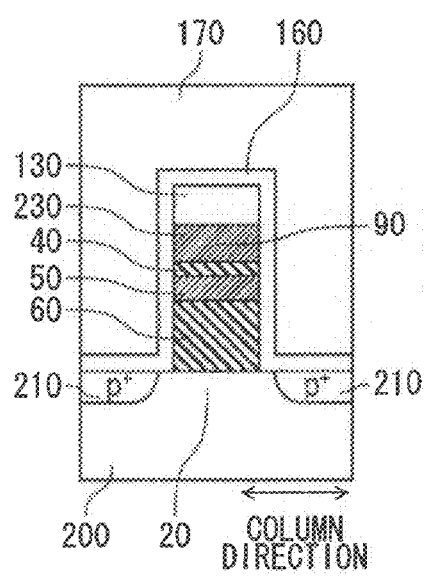
FIGS. 14A and 14B show a modification of the nonvolatile semiconductor storage device according to the second embodiment.
Figure 14B:
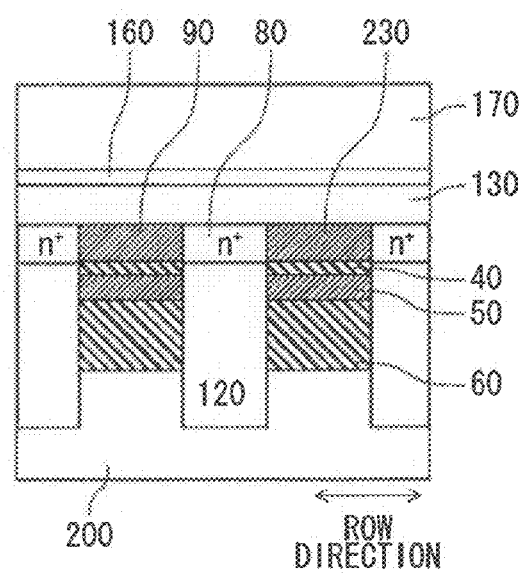

FIGS. 14A and 14B show a modification of the memory cell of the nonvolatile semiconductor storage device according to the second embodiment of the invention. FIG. 14A is a sectional view taken along the bit line direction, and FIG. 14B is a sectional view taken along the word line direction. Portions having the same portions as in FIG. 6A or 6B are given the same symbols as the latter and will not be described in detail.

This embodiment is different from the above-described second embodiment in that the vertical arrangement of the insulating layers of the MONOS memory cell transistor is opposite to that in the second embodiment. Different points than in the second embodiment will mainly be described below.

Adjacent to an n-type silicon substrate (semiconductor substrate 200), $p^+$ second source/drain regions 210 are formed so as to be spaced from each other. The first channel region 20 is formed between these source diffusion layer and drain diffusion layer.

As in the case of the second embodiment, the second source/drain regions 210 are usually $p^+$ diffusion layers. However, where a NAND memory cell unit is formed by connecting plural memory cells (each configured as in this modification) to each other in series, it is possible to omit $p^+$ diffusion layers and use, as source/drain electrodes, inversion layers induced adjacent to the substrate surface by fringe electric fields extending from the gate electrodes of the adjacent memory cells.

Next, the structure of the gate stack which is located on then-type semiconductor substrate (semiconductor substrate 200) will be described. A 15-nm-thick alumina ($Al_2O_3$) film, for example, is formed as the block insulating film 60 on the first channel region 20. A 5-nm-thick silicon nitride ($Si_3N_4$) film is formed as the charge storage layer 50 on the block insulating film 60. A 5-nm-thick silicon oxynitride (SiON) film, for example, is formed as the tunnel insulating film 40 on the silicon nitride film (charge storage layer 50). A p-type semiconductor layer 230 (second channel region 90) is formed on the tunnel insulating film 40. As shown in FIG. 14B, $n^+$ first source/drain regions 80 are formed adjacent to the second channel region 90.

In the embodiment, plural block insulating films 60, plural charge storage layers 50, and plural tunnel insulating film 40 are formed in the row direction so as to be isolated from each other by device isolation insulating layers 120 having an STI (shallow trench isolation) structure.

In the embodiment, the n-type dopant impurity concentration of the first channel region 20 formed adjacent to the surface of the silicon substrate (or the dopant impurity concentration of the semiconductor substrate 200) is set at $1\times10^{19}$ cm$^{-3}$. The p-type dopant impurity concentration of the second channel region 90 which also functions as a control gate electrode is set at $1\times10^{18}$ cm$^{-3}$. That is, the dopant impurity concentration of the first channel region 20 is higher than that of the second channel region 90.

As for a driving method of this memory cell, a writing/erasing operation is performed by injecting charge into the silicon nitride film (charge storage layer 50) from the semiconductor layer 230 (second channel region 90) via the tunnel insulating film 40 and data reading is performed utilizing presence/absence of a channel current flowing through the first channel region 20 which is formed adjacent to the surface silicon substrate (semiconductor substrate 200).

A manufacturing method of the above device is within such a range as to be able to be realized by modifying the manufacturing method of the second embodiment, and the device can be manufactured by using ordinary apparatus and tools used in LSI processes. A process will not be described below in detail because it is not difficult to a person skilled in the art.

Embodiment 3

Figure 15A:
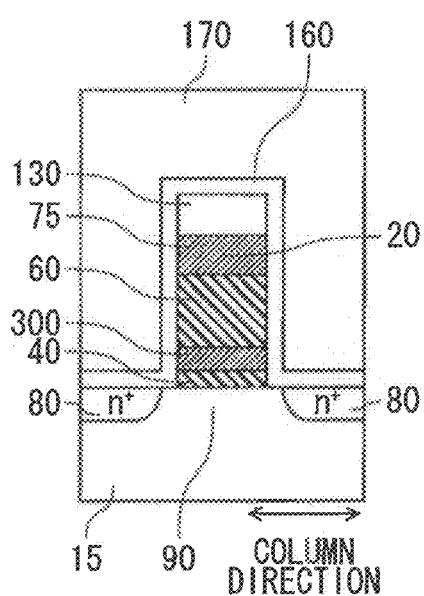
FIGS. 15A and 15B show a nonvolatile semiconductor storage device according to a third embodiment.
Figure 15B:
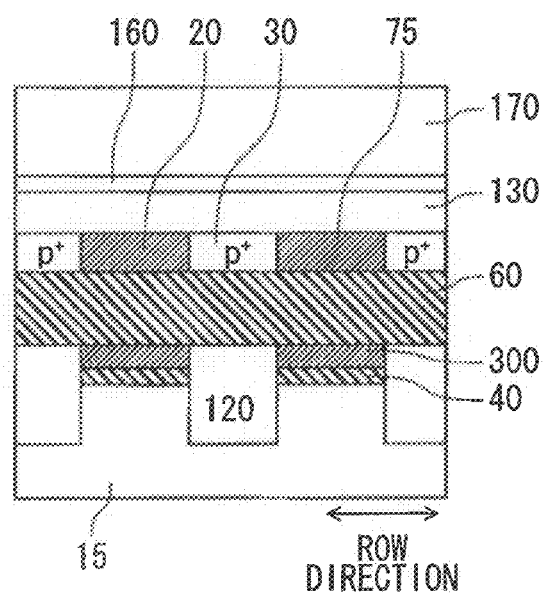

FIGS. 15A and 15B illustrate general structures of a memory cell of a nonvolatile semiconductor storage device according to a third embodiment of the invention. FIG. 15A is a sectional view taken along the bit line direction, and FIG. 15B is a sectional view taken along the word line direction. Portions having the same portions as in FIG. 6A or 6B are given the same symbols as the latter and will not be described in detail.

This embodiment is different from the above-described first embodiment in that the charge storage layer is not a silicon nitride film and is formed using phosphorus-doped silicon which is a conductive semiconductor. Different points than in the first embodiment will mainly be described below.

This embodiment is different from the first embodiment in the structure of the gate stack which is disposed on the p-type silicon substrate (semiconductor substrate 15). As in the first embodiment, a 5-nm-thick silicon oxynitride (SiON) film, for example, is formed as the tunnel insulating film 40 on the second channel region 90 which is adjacent to the surface of the p-type silicon substrate (semiconductor substrate 15). A 5-nm-thick phosphorus-doped polycrystalline silicon film is formed as a charge storage layer 300 on the tunnel insulating film 40. The phosphorus concentration in the silicon film is about $1\times10^{20}$ cm$^{-3}$. A 15-nm-thick alumina ($Al_2O_3$) film, for example, is formed as an interpoly insulating film (block insulating film 60) on the charge storage layer 300 (phosphorus-doped polycrystalline silicon). An n-type semiconductor layer 75 is formed as the first channel region 20 on the block insulating film 60. As shown in FIG. 15(b), $p^+$ first source/drain regions 30 are formed adjacent to the first channel region 20.

In the embodiment, the p-type dopant impurity concentration of the second channel region 90 of the p-type silicon substrate (semiconductor substrate 15) is set at $5\times10^{17}$ cm$^{-3}$. The n-type dopant impurity concentration of the first channel region 20 which functions as a control gate electrode is set at $5\times10^{18}$ cm$^{-3}$. That is, the dopant impurity concentration of the first channel region 20 is higher than that of the second channel region 90.

A driving method of this memory cell is similar to the driving method employed in the first embodiment. That is, a writing/erasing operation is performed by injecting charge into the charge storage layer 300 (phosphorus-doped polycrystalline silicon) from the surface of the semiconductor substrate 15 via the tunnel insulating film 40 and data reading is performed utilizing presence/absence of a channel current flowing through the first channel region 20.

A manufacturing method of the above device is within such a range as to be able to be realized by modifying the manufacturing method of the first embodiment, and the device can be manufactured by using ordinary apparatus and tools used in LSI processes. A process will not be described below in detail because it is not difficult to a person skilled in the art.

In the embodiment, the charge storage layer is made of polycrystalline silicon containing a dopant impurity, the composition of the charge storage layer is not limited to it. The charge storage layer may be made of any of a variety of conductive materials such as metals, metal nitrides, metal carbides, and metal silicides. For example, TiN or the like may be used instead of phosphorus-doped polycrystalline silicon.

The invention is not limited to the above-described embodiments. The charge storage layer used in the invention can be in various forms such as an insulating film, a conductive floating gate electrode, and conductive fine particles. The tunnel insulating film and the block insulating film used in the invention can also be in various forms. Although the tunnel insulating film is generally a silicon oxynitride film containing nitrogen inside the film, a multilayer structure consisting of a silicon oxide film, a silicon nitride film, and a silicon oxide film, or the like, it may be other films. For example, the tunnel insulating film may be high-permittivity (high-k) insulating film or a multilayer film consisting of different high-k insulating films. On the other hand, the block insulating film (or interpoly insulating film) is not limited to an alumina film and may have an alumina/silicon oxide film/alumina structure. Other example materials of the block insulating film (or interpoly insulating film) are lanthanum aluminum, lanthanum aluminate, and lanthanum aluminum silicate. The block insulating film (or interpoly insulating film) may be conventional multilayer films such as one consisting of a silicon oxide film, a silicon nitride film, and a silicon oxide film and one consisting of a silicon nitride film, a silicon oxide film, a silicon nitride film, a silicon oxide film, and a silicon nitride film.

In general, the block insulating film (or interpoly insulating film) has a larger capacitance than the tunnel insulating film. The capacitance of the block insulating film (or interpoly insulating film) may be made larger by increasing its area by properly modifying the device structure in addition to the use of the factor that it is higher in average material permittivity than the block insulating film. For example, the capacitance of the block insulating film (or interpoly insulating film) can be increased by forming portions of the block insulating film (or interpoly insulating film) also on the side surfaces of the floating gate electrode 300 and forming the control gate electrode so as to cover those portions.

The gate stack structure of each memory cell according to the invention may be formed in a well region that is formed in the vicinity of the surface of a silicon substrate. An SiGe substrate, a Ge substrate, an SiGeC substrate, or the like may be used in place of the silicon substrate, and a memory cell structure may be formed in a well region of any of those substrates. Furthermore, the memory device according to the invention may be formed in an SOI (silicon on insulator) substrate.

In the invention, it is desirable that the first channel region 20 and the second channel region 90 be semiconductors of different conductivity types because such a device can be formed on an ordinary silicon substrate and operate. If the first channel region 20 and the second channel region 90 are of the same conductivity type, inversion layers cannot be formed there at the same time and one of them becomes a storage layer. However, in the case where the memory device according to the invention is formed on an SOI (silicon on insulator) substrate, the first channel region 20 and the second channel region 90 may have the same conductivity type. In the invention, the transistor corresponding to the first channel region 20 and the transistor corresponding to the second channel region 90 have four possible combinations: (n channel, p channel), (n channel, n channel), (p channel, p channel), and (p channel, n channel).

The concept of the invention can be applied to memory cells having a three-dimensional structure. For example, the concept of the invention can be applied to a laminated flash memory (MONOS type or floating gate type) and the like. Where the invention is applied to a MONOS memory cell, the invention can be applied irrespective of the MONOS operation scheme. That is, for example, the invention can be applied to a device operation scheme in which charge is stored in each of charge storage layers at the source end and the drain end of a MONOS transistor and a conversion-into-multi-value operation is performed.

The invention mainly relates to a memory cell elemental technique and is independent of the circuit-level connection method of a memory cell. Therefore, the invention can be applied to not only a NAND nonvolatile semiconductor memory but also NOR, AND, DINOR nonvolatile semiconductor memories, a 2-transistor flash memory in which superior features of the NOR type and the NAND type are fused, a 3-transistor NAND nonvolatile semiconductor memory in which one memory cell is sandwiched between two selection transistors, and the like. The invention can also be applied to a flash memory having an architecture that is provided with a NAND-type interface and a NOR-type high-reliability, high-speed reading function.

Although the several embodiments of the invention have been described above, they are just examples and should not be construed as restricting the scope of the invention. Each of these novel embodiments may be practiced in other various forms, and part of it may be omitted, replaced by other elements, or changed in various manners without departing from the spirit and scope of the invention. These modifications are also included in the invention as claimed and its equivalents.

The invention claimed is:

1. A nonvolatile semiconductor storage device comprising: a plurality of nonvolatile memory cells each comprising:
    a first semiconductor layer comprising:
        a first source region and a first drain region spaced from each other;
        a first channel region formed between the first source region and the first drain region;
    a block insulating film directly formed on the first channel region of the first semiconductor layer;
    a charge storage layer directly formed on the block insulating film;
    a tunnel insulating film directly formed on the charge storage layer;
    a second semiconductor layer directly formed on the tunnel insulating film and comprising:
        a second source region and a second drain region spaced from each other; and
        a second channel region formed between the second source region and the second drain region, wherein a dopant impurity concentration of the first channel region is higher than a dopant impurity concentration of the second channel region.

2. The device of claim 1, wherein the first semiconductor layer is formed on a surface of a semiconductor substrate.

3. The device of claim 1, wherein the second semiconductor layer is formed on a surface of a semiconductor substrate.

4. The device of claim 1, wherein the first semiconductor layer and the second semiconductor layer have different conductivity types.

5. The device of claim 1, wherein the first semiconductor layer is an n-type semiconductor and the second semiconductor layer is a p-type semiconductor.

6. The device of claim 1, wherein the dopant impurity concentration of the first semiconductor layer is in a range of $10^{17}$ to $10^{20}$ cm$^{-3}$ and is 5 to 50 times the dopant impurity concentration of the second semiconductor layer.

7. The device of claim 1, wherein the plurality of nonvolatile memory cells are connected to each other in series, and selection gate transistors are connected to both ends of the plurality of nonvolatile memory cells, so that the nonvolatile semiconductor storage device acts as a NAND memory cell unit.

8. The device of claim 1, wherein a data writing operation is performed using the second channel region of the second semiconductor layer and a data reading operation is performed using the first channel region of the first semiconductor layer.

9. The device of claim 1, wherein the impurity concentration of the first channel region is in a range of $10^{17}$ to $10^{20}$ cm$^{-3}$.

* * * * *